United States Patent [19]

Woods et al.

[11] 4,014,772
[45] Mar. 29, 1977

[54] METHOD OF RADIATION HARDENING SEMICONDUCTOR DEVICES

[75] Inventors: Murray Henderson Woods, Los Gatos, Calif.; Richard Williams, Princeton, N.J.

[73] Assignee: RCA Corporation, New York, N.Y.

[22] Filed: Apr. 24, 1975

[21] Appl. No.: 571,261

[52] U.S. Cl. .......................... 204/180 R; 65/30 R; 204/130; 204/157.1 R; 250/283
[51] Int. Cl.² ................... C25D 1/12; G01N 27/00
[58] Field of Search .............. 204/180 R, 130, 164, 204/157.1 R; 65/30; 117/93.4 R; 250/49.5 TE, 42, 49.5 RE, 49.5 P; 29/576, 584; 330/33

[56] References Cited
UNITED STATES PATENTS

| | | | |
|---|---|---|---|
| 2,971,853 | 2/1961 | Stookey | 204/157.1 R X |
| 3,218,220 | 11/1965 | Weber | 204/130 X |
| 3,445,209 | 5/1969 | Asunmaa | 204/157.1 R X |
| 3,446,722 | 5/1969 | Stein et al. | 204/180 R |
| 3,570,112 | 3/1971 | Barry et al. | 29/571 |
| 3,650,931 | 3/1972 | Henrie | 204/180 R |
| 3,691,376 | 9/1972 | Bauerlein et al. | 250/49.5 TE |
| 3,872,492 | 3/1975 | Robbins | 357/23 |
| 3,879,183 | 4/1975 | Carlson | 65/30 |

OTHER PUBLICATIONS

Powell and Derbenwick, "Vacuum U. V. Radiation Effects in $SiO_2$," IEEE Transactions on Nuclear Science, vol. NS–18, No. 6, Dec. 1971.
Yon et al., "Sodium Distribution in Thermal Oxide on Silicon by Radiochem. and MOS Analysis," IEEE Transactions, vol. Ed–13, No. 12, Feb. 1966.
Woods et al., "Injection and Removal of Ionic Charge at Room Temp. Through the Interface of Air with $SiO_2$," J. Appl. Phys., vol. 44, No. 12, Dec. 1973.
Martin, "Use of Radiation to Promote Chem. Reactions," C & E News, vol. 33, No. 14, 4-4-1955, pp. 1424–1428.
Rose et al., "Condensed Chemical Dictionary," 7th Ed., pp. 30 & 31.

Primary Examiner—Arthur C. Prescott
Attorney, Agent, or Firm—H. Christoffersen; R. P. Williams; W. L. Muckelroy

[57] ABSTRACT

An electronic device, such as a metal-oxide-semiconductor (MOS) transistor, is radiation hardened by removing impurities such as sodium and other alkali species, from the oxide. The impurities are first caused to migrate to the surface of the oxide by exposure to electromagnetic radiation having an energy greater than the oxide band gap while the oxide is immersed in an electric field. The impurities are then rinsed from the surface of the oxide with a solvent.

9 Claims, 1 Drawing Figure

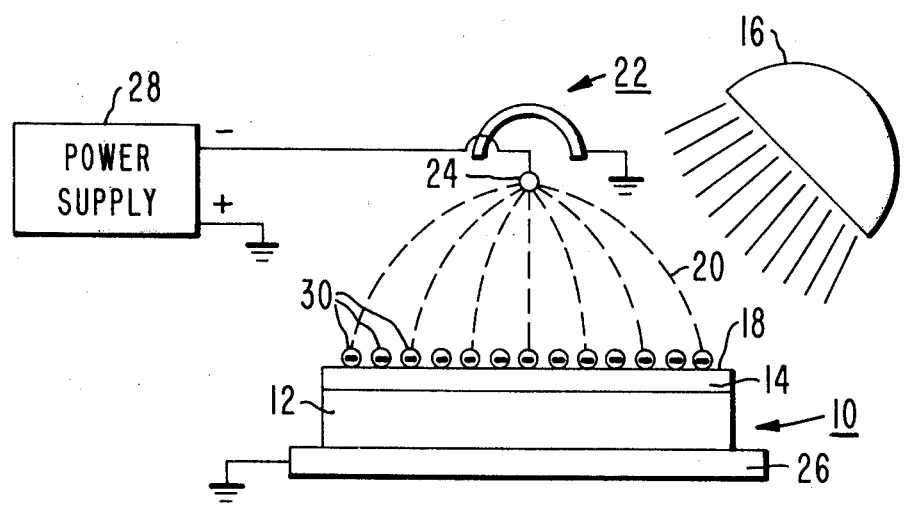

METHOD OF RADIATION HARDENING SEMICONDUCTOR DEVICES

This invention relates to a method of radiation hardening a layer of a dielectric. The method is useful for freeing alkali species i.e. alkali metal compounds and alkali atoms from dielectrics made of oxides of silicon. The method is particularly useful for permanently removing these alkali species.

It has been known that certain insulated-gate-field-effect-transistors (IGFET's), such as P channel metal-insulator-semiconductor (MIS) transistors, having silicon dioxide ($SiO_2$) gate insulators (MOS transistors), for example, exhibit increased threshold voltages after exposure to radiation. It is suggested that this occurs because the radiation ionizes the $SiO_2$ and thereby creates electron-hole pairs in the $SiO_2$. The electrons are absorbed in the semiconductor or trapped at the interface. The holes transfer charge to alkali species, i.e. atoms, proximate to the ionized $SiO_2$ molecule and thereby create positively charged alkali metal ions. Some alkali metal ions may be ionized directly by the radiation. These alkali metal ions make a larger voltage on the gate necessary to turn on the P channel MOS transistor, i.e., the alkali metal ions must be compensated for.

It has been proposed to decrease the effects of radiation damage in an MOS device by ion implantation of aluminum (Al) ions into the gate oxide. The aluminum atoms which result from the implanation act as electron traps to compensate for trapped holes. The ion implantation of Al ions into only the gate oxide, without doping the semiconductor material underneath it, however, is difficult to control because the gate oxide is, relatively, very thin. According to calculations, for example, a low ion-accelerating voltage of about 15 KeV or less should be used in order not to dope the semiconductor material (usually silicon) below the gate oxide with the implanted Al ions. These low ion-accelerating voltages, however, are usually below the normal operating range of most ion-implanting machines in common use. Also, at these low ion-accelerating voltages, the Al ion current that can be obtained is, relatively, very small, being in the nanoampere range, and consequently, excessively long (about 1000 hours) implants are necessary to secure the high doping concentration that is usually necessary. In accordance with the novel method of the present invention, the necessity of using ion-implantation is obviated.

It has been proposed to gather the alkali metal ions by introducing chlorine (Cl) atoms into the gate oxide. The ion implantation of chlorine atoms into a thin (about 500 A to 1200 A thick) gate oxide, however, presents the same difficulties described for the implantation of aluminum atoms into the gate oxide. Because the gate oxide is relatively thin and the ion-accelerating voltage for the chlorine ions should be relatively low to prevent penetration through the gate oxide, it is substantially impractical to ion implant the chlorine ions.

Briefly stated, the novel method of the present invention makes use of steps which free the alkali species from the gate insulator. Consequently, the radiation effect which is manifested as a shift in the threshold voltage is cured. The steps include the ionization of the alkali species with electromagnetic radiation to form positive alkali metal ions and then attracting the positive alkali ions to the surface of the gate insulator by subjecting the ions to a strong electric field. The alkali ions on the surface of the gate insulator are then removed by a suitable means such as rinsing the surface of the gate insulator with a fluid such as, for example, deionized water. The alkali ions may also be either chemically or abrasively removed from the surface of the gate insulator.

The FIGURE is a schematic drawing of an apparatus for applying a corona discharge to a surface of an insulator to apply an electrostatic charge on the surface thereof.

The novel method can be applied to any of the insulating materials used in the integrated circuit and semiconductor arts wherein the insulating materials have mobile impurity metal ions therein. Thus, insulating materials of silicon dioxide, silicon oxide, silicon nitride, tantalum oxide, and aluminum oxide, for example, may be treated advantageously by the novel method. The novel method, however, is probably most useful for removing mobile impurity ions from silicon dioxide layers in almost any of the configurations used in silicon semiconductor devices. This includes, for example, the planar layers of oxide that are used in MOS devices, integrated circuit devices, and transistor and diode structures.

The novel method will be illustrated herein for a single planar oxide layer. Referring now to the FIGURE of the drawing, there is shown a semiconductor device 10 comprising a wafer 12 of silicon, having thereon a layer 14 of silicon dioxide. When, for example, the device 10 contains integrated circuits, the silicon dioxide layer 14 can be considered as a passivating layer. If, however, the device 10 is to be fabricated into an MOS device, the silicon dioxide layer 14 can be considered as the layer of insulating material upon which a gate electrode is to be subsequently deposited.

In carrying out the preferred novel method as shown in the FIGURE, the insulator 14 as formed on the semiconductor 12 is partially ionized by exposure to a flux of ionizing energy or radiation a source 16 of energized particles such as photons of electromagnetic radiation, for example, ultraviolet light. Assuming the band gap of the insulator to be $E_g$, it first is necessary for the radiation to have a DeBroglie wave length $\lambda$, or energy per particle or photon, equal to or greater than that corresponding to the band gap $E_g$. Second, to insure ionization of an adequate number of the alkali metal atoms within the insulator, it is necessary that the flux from the source 16 be at least approximately $10^{10}$ particles per square centimeter per second.

The electrical field which is required to attract the alkali metal ions to a surface 18 of the insulator 14 is prefereably formed on the surface 18 by means of a corona discharge 20 onto the surface 18. The corona discharge 20 is produced by a corona discharge device 22 disposed above the layer 14 which comprises means for directing the corona discharge 20 onto the surface 18. The corona discharge 20 is produced by charging an electrode 24 in a dielectric fluid, such as air, for example, up to a voltage of 8 to 10 kV by means of power supply 28. The negative electrode 24 or cathode is negatively charged to this value and located 3 to 6 cm away from the gate insulator 14. The semiconductor 12 on which the insulator 14 lies is placed on a conductor 26 which is grounded with respect to the device 22. A voltage of at least 100 to 110 volts across the insulator 14 is usually obtained for an insulator thickness of approximately 1000 A. Charges in the form of negatively charged $CO_3^-$ ions 30 are transferred to the surface 18 of insulator 14 by the corona discharge 20 or corona breakdown of the device 22.

EXAMPLE

A gate insulator comprised of a layer of 1000 A of steam grown $SiO_2$ on a silicon wafer may be treated in the following manner. A negative charging voltage of 10 kV on a cathode placed 5 cm from the layer will produce at least a $10^7$ v/cm electrical field in the $SiO_2$, the silicon being electrically grounded with respect to the charging circuit. Sodium and other alkali metal ions are created by exposure of the $SiO_2$ layer to ultraviolet radiation (at 1400 A) having an energy corresponding to a band gap for $SiO_2$ of 8.8 electron volts. The electric field is believed to be formed at the surface of the $SiO_2$ layer by carbonate [$CO_3^-$] ions at the surface. The sodium and other alkali metal ions drift to the surface of the $SiO_2$ and form either sodium hydroxide (NAOH) or sodium bicarbonate [$Na_2(CO_3)_2$]. The alkali residue is removed by a standard cleaning process.

The standard cleaning process may comprise two steps. First, the $SiO_2$ layer is washed for five minutes in a solution of four parts water, one part hydrogen peroxide ($H_2O_2$), and one part ammonium hydroxide ($NH_4OH$). Secondly, after rinsing in deionized water, the $SiO_2$ layer is washed for five minutes in a solution of four parts of water, one part of hydrogen peroxide ($H_2O_2$), and one part of concentrated hydrochloric acid (HCl) at a temperature of 100° C.

In the foregoing example and in the novel method of the invention, additional steps are necessary to eliminate any electrochemical charging of the insulator. It is also necessary to eliminate electrons and holes trapped in the insulator as a result of the exposure to the ultraviolet electromagnetic radiation. The electromagnetic charging and the trapped holes and electrons may be removed by annealing the insulator at a temperature of 150° to 200° C for at least 1 hour in an air ambient.

Electrochemical charging may also occur from ionic solutions created by water present in the oxide as a result of the steam growth technique or from the absorption of water molecules during the standard cleaning process. This additional electrochemical charging may be eliminated by heating the sample to a temperature of 600° C in a vacuum for a short period, for example three minutes.

Thus, in accordance with the novel method of exposure to electromagnetic radiation and a negative electrical field, means are provided to free alkali species from an insulator and enables these alkali species to form at the surface of the gate insulator and to be easily removed by standard cleaning steps commonly used in the semiconductor industry. Hence, the novel method provides for radiation hardening of silicon dioxide and other oxides of silicon without the need for implantation of aluminum or other ions. Moreover, this method obviates the utilization of halide ions for gettering of $SiO_2$ layers.

I claim:

1. A method for enabling a metal-dielectric-semiconductor device, having alkali metal as atoms or compounds, and alkali metal ions in the dielectric to avoid ionization of the alkali metal atoms or compounds by ionizing radiation comprising the steps of:
    exposing the device to a flux of ionizing electromagnetic radiation sufficient to create alkali metal ions from the alkali metal atoms or compounds in the dielectric;
    charging a surface of the dielectric with a negative charge; and
    removing ions which have drifted to the surface of the dielectric.

2. The method of claim 1, wherein the radiation has a DeBroglie wave length corresponding to an energy greater than at least an 8.8 electron volt band gap energy for the dielectric.

3. The method of claim 2, wherein the radiation is sufficient to penetrate the dielectric.

4. The method of claim 3, wherein the surface of the dielectric is charged in a dielectric fluid and irradiated with a flux of ionizing electromagnetic radiation in a dielectric fluid.

5. The method of claim 4, wherein the ionizing electromagnetic radiation is ultraviolet electromagnetic radiation.

6. The method of claim 5, wherein the dielectric is an oxide of silicon.

7. The method of claim 6, wherein the dielectric fluid is air.

8. The method of claim 7, wherein the step of removing ions or atoms at a surface of the dielectric comprises contacting the dielectric with a solvent.

9. The method of claim 8, wherein the removing step further comprises the step of heating the device in a vacuum.

* * * * *